United States Patent [19]

Isono et al.

[11] Patent Number: 4,957,845

[45] Date of Patent: Sep. 18, 1990

[54] PRINTING PLATE

[75] Inventors: Masanao Isono; Ken Kawamura; Masaya Asano; Tetuo Suzuki; Shigeo Abiko, all of Shiga, Japan

[73] Assignee: Toray Industries, Incorporated, Tokyo, Japan

[21] Appl. No.: 353,342

[22] Filed: May 17, 1989

[30] Foreign Application Priority Data

May 18, 1988 [JP] Japan ................................. 63-121330
May 20, 1988 [JP] Japan ................................. 63-124684

[51] Int. Cl.$^5$ ........................ G03C 1/52; G03F 7/021; G03F 7/023
[52] U.S. Cl. .................................... 430/156; 430/162; 430/166; 430/171; 430/303; 430/175; 430/191
[58] Field of Search ............... 430/192, 162, 303, 156, 430/171, 191, 166

[56] References Cited

U.S. PATENT DOCUMENTS

| | | | |
|---|---|---|---|
| 2,702,243 | 2/1955 | Schnardt | 430/166 |
| 3,933,499 | 1/1976 | Traskos | 430/156 |
| 4,804,614 | 2/1989 | Halle | 430/312 |

FOREIGN PATENT DOCUMENTS

B130222 5/1988 European Pat. Off. .
55-55343 4/1980 Japan .

Primary Examiner—Paul R. Michl
Assistant Examiner—John S. Y. Chu
Attorney, Agent, or Firm—Scully, Scott, Murphy & Presser

[57] ABSTRACT

The present invention is concerned with a printing plate of which image formation is done by photoirradiation, having a front side covered waith a peelable or removable protective layer which contains a photofading material. The printing plate is safe against fogging to light and can be used under ordinary illumination.

17 Claims, No Drawings

PRINTING PLATE

BACKGROUND OF THE INVENTION (1) Field of the Invention

The present invention relates to a printing plate which can be easily handled in a light room and is superior in vacuum contact with an image pattern.

(2) Description of the Prior Art

Printing plates are required to be improved in sensitivity and resolution, and researches and development thereof have been made positively. On the other hand, with improvement of those characteristics, there is an increasing tendency to the demand for accuracy of handling in the exposure (meaning irradiating light which is effective to induce a photoreaction of a printing plate, to a front side through an image pattern for the purpose of forming the image thereon, hereinafter referred to simply as "exposure", the "front side" indicating a surface to be exposed to light for image formation) and developing steps. More particularly, in order for the printing plate to fully exhibit its characteristics it is dustproofing and light shielding. Especially as to shielding the active light, even a slight fogging to active light other than image forming exposure is not allowable. It would impair the characteristics of the printing plate, so it has recently become necessary to make a strict control of the illumination environment.

However, the stricter the illumination environment (e.g. precision works under a yellow or red lamp to shield light which is effective to induce a photoreaction of the printing plate), the greater becomes the visual fatigue of the worker. To avoid this inconvenience, there are many users who desire to work in a light room.

Where the printing plate is exposed to light through a positive or negative image pattern, vacuum contact is usually performed in order to enhance the contact to the image pattern. In this connection, it is known that various uneven treatments or irregular treatments are applied to the front side of the printing plate with a view to improving such contact. However, if these treatments are performed to excess for the said purpose, the scattering of light will be increased during exposure, resulting in deteriorated reproducibility for image patterns, although the contact to the image pattern will be improved. Thus, it is difficult to keep the balance.

SUMMARY OF THE INVENTION

It is the object of the present invention to improve the above-mentioned problems of the prior art.

The present inventors found out that it substantially became possible to effect operations in a light room without impairing the required characteristics such as high sensitivity and high resolution by covering the front side of the printing plate with a peelable or removable protective layer containing a photofading material, more preferably applying a specific irregular treatment to the protective layer. Thus we reached the present invention.

More specifically, the present invention resides in a printing plate of which image formation is done by photo-irradiation, the front side of said printing plate being covered with a peelable or removable protective layer, said protective layer containing a photofading material.

The following are preferred embodiments of the present invention.

(1) A printing plate which is a dry planographic printing plate having a plate construction wherein a base substrate, a photosensitive layer, an ink-repellent layer and the protective layer are overlied together in this order, or alternatively the base substrate, the ink-repellent layer, the photosensitive layer and the protective layer are overlied together in this order.

(2) A printing plate wherein the quantum efficiency of the photofading material is in the range of 0.01 to 1.00, more preferably 0.10 to 1.00, most preferably 0.20 to 1.00.

(3) A printing plate wherein the photofading material is an aromatic diazonium salt compound.

(4) A printing plate wherein the optical density of the protective layer containing the photofading material is in the range of 0.01 to 2.00, more preferably 0.20 to 2.00.

(5) A printing plate wherein the protective layer contains particles having an average particle diameter of 4 to 9 $\mu$m as measured by a coulter counter method and a refractive index of 1.40 to 1.70, more preferably 1.40 to 1.60.

(6) A printing plate as set forth in the above (5) wherein the amount of the particles incorporated in the protective layer is in the range of 0.001 g/m$^2$ to 0.1 g/m$^2$, more preferably 0.01 g/m$^2$ to 0.1 g/m$^2$.

(7) A printing plate wherein the protective layer has a thickness in the range of 0.1 $\mu$m to 20 $\mu$m, more preferably 3 $\mu$m to 20 $\mu$m.

(8) A printing plate wherein the protective layer comprises the photofading material and a plastic film.

(9) A printing plate wherein the protective layer is a filmy layer formed by laminating a layer comprising the photofading material and a binder to the surface of a plastic film.

(10) A printing plate wherein the protective layer comprises the photofading material and particles having an average particle diameter of 4 to 9 $\mu$m as measured by a coulter counter method and a refractive index of 1.40 to 1.70.

(11) A printing plate wherein the protective layer is a filmy layer formed by laminating a layer comprising the photofading material, particles having an average particle diameter of 4 to 9 $\mu$m as measured by a coulter counter method and a refractive index of 1.40 to 1.70, and a binder to the surface of plastic film.

DESCRIPTION OF THE PREFERRED EMBODIMENTS

Examples of the printing plate as referred to herein include various planographic printing plates, photosensitive relief image printing plates and photosensitive gravure plates. The planographic printing plates as referred to herein are broadly classified into presensitized plates (hereinafter referred to simply as "PS plate") which require dampening water, and dry planographic printing plates which employ a silicone rubber layer or a fluorine-containing compound layer as an ink-repellent layer. The former PS plates were predominant planographic printing plates in the past and many practical inventions accomplished, while as to the latter dry planographic printing plates, researches and developments have recently been made, taking note of them as new printing plates not requiring dampening water. A lot of dry planographic printing plates have been proposed; for example, those substantially having a plate construction wherein a base substrate, a photosensitive layer and an ink-repellent layer are overlied together in this order, such as those disclosed in Japanese Pat. Publication (JP-B) Nos. 54-26923, 56-23150, 61-54222 and 59-28479 as well as Japanese Pat. Laid Open (JP-A) Nos. 60-21050 and 60-229031, and those substantially having a plate construction wherein a base substrate, and ink-repellent layer and a photosensitive layer are overlied together in this order, such as those disclosed in Japanese Pat. Publication No. 56-14976 and Laid Open No. 56-25740.

The peelable or removable protective layer used in the present invention will be explained below.

The protective layer indicates a layer substantially containing a photofading material and positioned as a top layer on the front side of the printing plate. No limitation is placed on its construction if only it can be peeled off or removed in the stage of becoming a processed plate through the developing process after exposure.

For example, there may be adopted a construction wherein the photofading material is dispersed, preferably dispersed uniformly, throughout the interior of the protective layer, or a construction wherein the photofading material is dispersed non-uniformly in the protective layer, or present locally, for example, localized in the upper or lower portion of the protective layer.

Preferred examples of the protective layer satisfying the above conditions include various plastic films having the photofading material dispersed uniformly therein, laminated films obtained by forming a layer containing the photofading material on one or bothsides of various plastic films by coating, transferring, vapor deposition, or sputtering, and a film removable in the developing process formed by applying a binder resin containing the photofading material onto the front side the printing plate exemplified above. Above all, the various plastic films having the photofading material dispersed uniformly therein, and the laminated films obtained by forming a layer containing the photofading material on one or both sides of various plastic films by coating (together with a binder), transferring, vapor deposition or sputtering, are particularly preferred because the protective layer can be formed without inducing a mass transfer (e.g. impregnation of the photofading material into the printing plate) between it and the printing plate and further because the protective layer can be peeled off easily in the step prior to the developing process so it is possible to lessen the burden on the developing process (preventing the deterioration of a developing solution caused by the incorporation of the protective layer ingredients into the developing solution).

Examples of the plastic films referred as above include polyester film, polypropylene film, polyethylene film, polyvinyl chloride film, polyamide film, and ethylene-vinyl acetate copolymer film. Polyester film or polypropylene film is preferred. Particularly preferred in point of strength and transparency are biaxially stretched polyester films such as polyethylene terephthalate film, and biaxially stretched polypropylene films.

The binder referred to above is not specially limited if only it has a suitable bonding property and transparency. Examples are polyesters, polyamides, polyurethanes, polyvinyl alcohols, polyvinylidene chloride, chlorinated polypropylene, polyacrylonitrile and polyvinyl butyral. Preferred examples are solvent-soluble polyesters such as "NICHIGO POLYESTER" (a copolyester prepared by The Nippon Synthetic Chemical Industry Co., Ltd.) and "VYLON" (a copolyester prepared by Toyobo co., Ltd.), as well as polyvinyl butyral, polyurethanes and alcohol-soluble polyamides.

Furthermore, a transparent coating layer may also be formed on the protective layer, if necessary. For this coating layer there may be used the same materials as those just exemplified above in connection with the binder.

The photofading material is not specially limited at all if only it is transparent in the region of wavelength which is effective to induce a photoreaction of the printing plate after fading upon exposure to light (the said "transparent" means either exhibiting no absorption in the said wavelength region or exhibiting absorption only to an extent of having no substantial influence on the photoreaction of the photosensitive layer underlying the protective layer). But a preferred example of the photofading material is one which protects the printing plate from the fogging by shielding or attenuating the active light from the light source and which, when exposure is effected using a light source containing light which is effective to induce a photoreaction of the printing plate, absorbs the light from that light source, fades immediately and becomes transparent in that wavelength region.

Therefore, a suitable photofading material is selected according to the region of wavelength which is effective to induce a photoreaction of the printing plate and the wavelength region of emitted light of the exposure light source. For the above reason it is desirable that the quantum efficiency (the efficiency of photofading in case of a certain-time exposure using a specified light source, assuming that the case where photofading of one molecule occurs at the absorption of one photon is equal to 1) be in the range of 0.01 to 1.00, more preferably 0.10 to 1.00, particularly preferably 0.20 to 1.00. It is preferable for the photofading material to have a quantum efficiency within this range because there will be no obstacle to the exposure of the printing plate nor will there be little deterioration of sensitivity. Examples of those which satisfy these characteristics include various dyes, photochromic compounds and diazo compounds which upon absorption of light undergo oxidative and/or reductive reaction or decomposition and fade. More concrete examples are as follows.

As disperse dyes, azo-type disperse dyes (e.g. C.I. Disperse Orange 30, C.I. Disperse Yellow 114, C.I. Disperse Orange 13, C.I. Disperse Yellow 56), anthraquinone-type disperse dyes (e.g. C.I. Disperse Red 60), quinophthalone-type disperse dyes (e.g. C.I. Disperse Yellow 64), nitrophenylamine-type disperse dyes (e.g. C.I. Disperse Yellow 42), styryl-type disperse dyes (e.g. C.I. Disperse Yellow 49).

As cation dyes, conjugated cation-type azo dyes (e.g. C.I. Basic Yellow 25), non-conjugated cation-type azo dyes (e.g. C.I. Basic Red 18), styryl-type cation dyes (e.g. C.I. Basic Yellow 11, C.I. Basic Yellow 28, C.I. Basic Yellow 19), coumalin-type cation dyes (e.g. C.I. Basic Yellow 40).

As reactive dyes, vinylsulfone-type dyes (e.g. C.I. Reactive Blue 19) triazine-type dyes (e.g. C.I. Reactive Orange 4, C.I. Reactive Orange 13).

As other dyes, triphenylmethane-phthalide-type dye (e.g. Crystal Violet Lactone; USP 2548366), fluoran-type dyes (e.g. 3-diethylamino-6-methyl fluoran), phenothiazine-type dyes (e.g. 3,7-bis(dimethylamino)-

10-benzoylphenothiazine leucoauramine-type dyes, spiropiran-type dyes (e.g. 1,3,3-trimethylindoline-2,2'-spiro-6'-nitro-8'-methoxybenzopyran), rhodamine lactam-type dyes, triphenylmethane-type dyes.

Various o-benzoquinonediazide compounds, various o-naphthoquinonediazide compounds, p-benzoquinonediazide compounds, and various aromatic diazonium salt compounds, such as, for example, p-N,N-dimethylaminobenzenediazonium zinc chloride, 4-morpholino-2,5-dibutoxybenzenediazonium ainc chloride, 4-(4'-methoxy)-benzoylamino-2,5-diethoxybenzenediazonium zinc chloride, 4-morpholino-2,5-diethoxybenzenediazonium zinc chloride, p-N,N-diethoxyaminobenzenediazonium tetrafluoro borate, 4-morpholinobenzendiazonium tetrafluoro borate, 4-morpholino-2,5-dibutdxybenzenediazonium tetrafluoro borate, 4-pyrrolidino-3-methoxybenzenediazonium tetrafluoro borate, 4-(p-tolylmercapto)-2,5-dimethoxy-benzenediazonium tetrafluoro borate, 4-morpholino-2,5dibutoxybenzenediazonuim hexafluoro phosphate, 4-(p-methoxy)-benzoylamino-2,5-diethoxybenzenediazonium tetrafluoro borate, 4-pyrrolidino-3-methylbenzenediazonium hexafluoro phosphate, 4-(p-tolylmercapto)-2,5-diethoxybenzenediazonium hexafluoro phosphate, and diazo resins represented by the following general formula [1]:

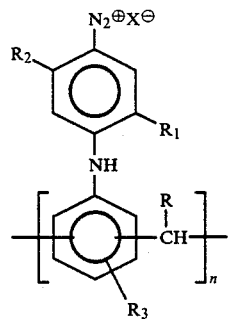

wherein $R_1$, $R_2$ and $R_3$ are each hydrogen, $C_1$-$C_{20}$ alkyl or alkoxy; R is hydrogen, $C_1$-$C_{20}$ alkyl or phenyl; X represents $PF_6$ or $BF_4$; and n is an integer of 1 to 200.

Among the photofading materials exemplified above, various o-benzoquinonediazide compounds, o-naphthoquinonediazide compounds, p-benzoquinonediazide compounds and aromatic diazonium salt compounds are preferred. More preferred in point of quantum efficiency and preservability are aromatic diazonium salt compounds such as 4-morpholino2,5-dibutoxybenzenediazonium hexafluoro phosphate, 4-(p-methoxy)-benzoylamino-2,5-diethoxybenzenediazonium tetrafluoro borate, 4-pyrrolidino-3-methylbenzenediazonium hexafluoro phosphate, and 4-(p-tolylmercapto)-2, 5diethoxybenzenediazonium hexafluoro phosphate.

To have the effects of the present invention exhibited effectively, there may be used various sensitizers often used commonly, as well as stabilizers if necessary such as, for example, various organic acids, polymer acid and polymerization inhibitors, for the purpose of improving the photofading efficiency during irradiation or preventing fading in a dark reaction.

The content of the photofading material in the protective layer differs depending on the wavelength range of absorption and fading speed of that material as well as the thickness of the protective layer, but usually it is preferable that the photofading material be used so as to be 0.01 to 2.00 in terms of optical density (hereinafter referred to simply as "OD"), more preferably 0.20 to 2.00 in terms of OD. Further, from the standpoint of image reproducibility, the thickness of the whole of the protective layer is preferably in the range of 0.1 μm 20 μm, more preferably 3 μm to 20 μm.

In addition to the photofading material, various matting agents for irregular treatment, i.e., various kinds of particles, are added positively to the protective layer in the range not impairing the effects of the present invention for the purpose of improving the contact between a image pattern and a printing plate. The "particles" as referred to herein have the following characteristics.

(1) The average particle diameter as measured by a coulter counter method should be in the range of 4 μm to 9 μm.

(2) The refractive index of the particles should be in the range of 1.40 to 1.70, preferably 1.40 to 1.60.

Examples of such particles include natural silica particles (e.g. "MINEX® #7", a product of Shiraishi Kogyo Kaisha Ltd.), calcium carbonate (e.g. "WHITON® P-30", a product of Shiraishi Kogyo Kaisha Ltd.), synthetic silica particles (e.g. "SYLOID® 63", a product of Fuji-Davison Chemical Ltd.), mica, corn starch, and epoxy particles.

The particles are not limited to those just exemplified above. But in the present invention it is important for the particles to have specific ranges of average particle diameter and refractive index. By using those particles it becomes possible to diminish the difference in refractive index between the protective layer and the particles. The difference in refractive index between the resin component of the protective layer and the particles is not specially limited, but preferably not larger than 0.3, more preferably not larger than 0.1.

As to the particle size distribution of the particles in question, in view of the contact (vacuum contact in many cases) between a image pattern and the printing plate and also in view of the reproducibility of a fine pattern it is preferable that the proportion of particles not larger than 2 μ in diameter be 20 volume % or less and that of particles not smaller than 20 μ in diameter be 10 volume % or less. The amount of the particles to be added is preferably in the range of 0.001 to 0.1 g/m², more preferably 0.01 to 0.1 g/m².

The "coulter counter method" used in the present invention indicates the method described in the following literature:

W.H. Coulter, Proc, Soc. Natl, Electron, Conf., 12, 1034 (1957).

As explained above, by covering the front side of the printing plate with the peelable or removable protective layer containing the photofading material, the handleability in a light room can be improved without impairing the photosensitive characteristic of the printing plate. More preferably, by incorporating specific particles in the protective layer, the contact is improved and a further improvement can be expected for handleability.

The following examples are give to illustrate the present invention in more detail, but it is to be understood that the invention is not limited thereto.

EXAMPLE 1 & COMPARATIVE EXAMPLE 1

A protective layer having the following construction and composition was laminated using a laminator to the front side of a dry planographic printing plate of a positive type (an irradiated area is a non-printing area) having the same plate construction as in Example JP 54026923B wherein a base substrate, a photosensitive layer and a silicone rubber layer are overlied together in this order, and also having the following composition:

| Constituent Layers | Thickness | Contents and Proportions of Composition |
|---|---|---|
| Base substrate | (250μ) | Surface-roughened aluminum plate |
| Photosensitive layer | (10μ) | Addition product of glycidyl methacrylate with xylylenediamine (4 mol/1 mol) 95 wt parts Benzoin methyl ether 5 wt parts |
| Silicone rubber layer | (5μ) | Cured product of "SH781" (silicone gum produced by Toray Silicone Co., Ltd.) |
| Protective | (10μ) | 10 thick, biaxially stretched polyethylene terephthalale film coated by the application in a thickness of 0.05 g/m² of a composition prepared by incorporating synthetic silica particles* in a content of 0.025 g/m² into a diazo resin; (hexafluoro phosphate (quantum efficiency: 0.36, λmax = 390 nm) of a p-diazodiphenylamine/paraformaldehyde condensated resin) |

*Synthetic silica particles: "SYLOID ® 63" (a product of Fuji-Davison Chemical Ltd.), average particle diameter 6μ (the proportion of particles not larger than 2μ and those not smaller than 20μ: 10 wt % or less), refractive index 1.46

OD of the protective layer:

Before exposure: 0.8 (λmax = 390 nm)

After exposure: 0.01 (λmax = 390 nm) (under the following exposure conditions)

The printing plate was experimentally fogged to light under the following conditions, then a positive image pattern was placed on the printing plate, then vacuumed to remove the air layer present between the pattern film and the printing plate to bring the two into close contact with each other (this condition will hereinafter be referred to as "vacuum contact"), and thereafter the printing plate was subjected to a conventional image exposure and developing process (see the following conditions) to obtain a processed plate. The printing plate was superior in the contact to the positive image pattern and in about 15 seconds it came into vacuum contact with the film.

| Fogging light source | Fluoresent lamp (daylight color: 40W) |
|---|---|
| Illuminance | 0.05 mW/cm² (UV402A, a product of Orc Manufacturing Co., Ltd.) |
| Fogging light time | 15 minutes |
| Image exposure light source | Metal halide lamp ("EYE-DOLPHIN ®", 3kW, a product of Orc Manufacturing Co., Ltd.) |
| Illuminance | 11 mW/cm² (UV402A, a product of Orc Manufacturing Co., Ltd.) |
| Image exposure time | 90 seconds |

This processed plate was attached to a printing machine and printing was performed by a conventional method; as a result, there was obtained a printed matter superior in image reproducibility.

On the other hand, a printing plate of just the same construction and composition as the above except having a protective layer of the following composition was experimentally fogged to light, then in the same manner as above a positive image pattern was brought into vacuum contact with the printing plate, followed by image exposure and development to obtain a processed plate, then printing was performed using the processed plate. As a result, although the vacuum contact between the positive image pattern and the printing plate was good, there occurred "fog" of the photosensitive layer due to fogging to light and also occurred defective printing based on defective development (meaning that the portion which is originally an unexposed area and is to become a printing area after peeling off of the silicone rubber layer completely in the developing process, becomes an incomplete exposed area due to "fog" and there remains the silicone rubber layer to be peeled off).

Protective layer (11 μm thick):

a 10 μm thick, biaxially stretched polyethylene terephthalate film coated by the application in a thickness of 1 g/m² of a composition obtained by incorporating the following synthetic silica particles in a content of 0.025 g/m² into polyurethane "SZ-18" (a product of Sanyo Kasei K.K., refractive index 1.53)

Synthetic silica particles: "SYLOID ® 63" (a product of Fuji-Davison Chemical Ltd.), average particle diameter 6 μm (the proportion of particles not larger than 2 μm and that of particles not smaller than 20 μm: 10 wt% or less), refractive index 1.46

OD of the protective layer:

Before exposure: 0.01 (under the above exposure

After exposure : 0.01 conditions)

EXAMPLE 2 & COMPARATIVE EXAMPLE 2

A protective layer having the following construction and composition was coated using a reverse roll coater to the front side of a dry planographic printing plate of a negative type (an irradiated area is a printing area) having the same plate construction as in Example 1(A) of JP 61-054222B wherein a base substrate, a photosensitive layer and a silicone rubber layer and overlied together in this order, and also having the following composition:

| Constituent Layers | Thickness | Printing Plate Contents and Proportions of Composition |
|---|---|---|
| Base substrate | (300μ) | Aluminum plate subjected to a chemical conversion treatment |
| Photosensitive layer | (5μ) | Naphthoquinone-1,2-diazide-5-sulfonic acid ester of phenol novolak resin ("Sumilite Resin PR50235", a product of Sumitomo Durez Co., Ltd.) having an esterification degree of 44% 100 wt parts<br>4,4'-diphenylmethane diisocyanate 20 wt parts<br>Dibutyltin dilaurate 0.2 wt parts |
| Silicone rubber layer | (2.2μ) | Polydimethyl siloxane having OH groups at both ends (molecular weight: about 80,000) 100 wt parts<br>Ethyltriacetoxysilane 5 wt parts<br>Dibutyltin diacetate 0.2 wt parts<br>-aminopropyl triethoxy silane 3 wt parts |
| Protective layer | (10μ) | 4-morpholino-2,5-dibutoxybenzenediazonium hexafluoro phosphate (quantum efficiency: 0.43, max = 400 nm) 15 wt parts<br>Copolyester "TP220-S30MX" (a product of Nippon Synthetic Chemical Industry Co., Ltd.), refractive index: 1.49) 85 wt parts<br>Synthetic silica particles "SYLOID ® 63" (a product of Fuji-Davison Chemical Ltd.), refractive index: 1.46) 3 wt parts |

OD of the protective layer:
Before exposure: 0.65 ($\lambda$max = 400 mn)
After exposure: 0.01 ($\lambda$max = 400 nm) (under the same exposure conditions as in Example 1)

Under the same conditions as in Example 1 this printing plate was experimentally fogged to light, then a negative image pattern was brought into vacuum contact with the printing plate, followed by image exposure and developing process to obtain a processed plate. Then, the processed plate was attached to a printing machine and printing was performed by a conventional method. As a result there was obtained a printed matter superior in image reproducibility with little deterioration of sensitivity caused by the presence of the protective layer.

On the other hand, in the same manner as above except that the protective layer was peeled off, the printing plate was fogged to light, then to image exposure and development to obtain processed plate. As a result, there occurred "fog" in the unexposed area due to the fogging to light (in this case, conversely to Example 1, the fogging means that the unexposed area on which the silicone rubber layer should remain is exposed incompletely and the silicone rubber layer is peeled and comes off during the developing process like the exposed area) and the silicone rubber layer fell off throughout the whole plate surface.

EXAMPLES 3-6

Protective layers respectively containing such photofading materials as shown in Table 1 were each laminated to a dry planographic printing plate of a positive type in the same way as in Example 1.

| Constituent Layers | Thickness | Contents and Proportions of Composition |
|---|---|---|
| Protective | (11μ) | 10μ thick, biaxially stretched polyethylene terephthalate film coated the application of the following composition in a thickness of 1 g/m$^2$:<br>Any of the photofading materials shown in Table 1 10 wt parts<br>Copolyester "TP220-S30MX" (a product of The Nippon Synthetic Chemical Industry Co., ltd., refractive index: 1.49) 90 wt parts<br>Synthetic silica particles "SYLOID ® 63" (a product of Fuji-Davison Chemical Ltd., refractive index: 1.46) 4 wt parts |

TABLE 1

| Photofading Materials | Quantum Efficiency | $\lambda$max (nm) | Optical Density (OD) Before Exposure | After Exposure |
|---|---|---|---|---|
| 4-morpholino-2,5-dibutoxy-benzenediazonium hexafluoro phosphate | 0.43 | 400 | 0.43 | 0.01 |
| 4-(p-methoxy)-benzoylamino-2,5-diethoxybenzenediazonium tetrafluoro borate | 0.40 | 390 | 0.40 | 0.02 |
| 4-pyrrolidino-3-methyl-benzenediazonium hexafluoro phosphate | 0.30 | 400 | 0.34 | 0.02 |
| 4-(p-tolylmercapto)-2,5-diethoxybenzenediazonium hexafluoro phosphate | 0.43 | 395 | 0.35 | 0.03 |

Under the same conditions as in Example 1, these printing plates were each experimentally fogged to light, then a positive image pattern was brought into vacuum contact with the printing plate, followed by image exposure and developing process. The processed plates thus obtained were each attached to a printing machine and printing was performed by a conventional method. As a result, there were obtained printed matters superior in image reproducibility with little deterioration of sensitivity caused by the presence of the protective layers.

EXAMPLE 7 & COMPARATIVE EXAMPLE 3

A protective layer having the following construction and composition was coated using a reverse roll coater to the front side of a negative type printing plate having a plate construction wherein a base substrate and a photosensitive layer are overlied together in this order and having the following composition.

| Constituent Layers | Thickness | Printing Plate Contents and Proportions of Composition |
|---|---|---|
| Base substrate | (300μ) | Aluminum plate subjected to a chemical conversion treatment |
| photosensitive layer | (50μ) | 2-diazo-1-naphthol-5-sulfonic acid ester of polyhydroxyphenyl (same as that used in Example 1 of U.S. Pat. No. 3,635,709) |
| Protective layer | (3μ) | Potassium polystyrene-p-sulfonate 100 wt parts 4-morpholino-2,5-dibutoxybenzenediazonium hexafluoro phosphate (quantum efficiency: 0.43, λmax = 400 nm) 5 wt parts Synthetic silica particles "SYLOID ® 63" (a product of Fuji-Davison Chemical Ltd.), refractive index: 1.46) 3 wt parts |

OD of the protective layer:
Before exposure: 0.10 (400 nm)
After exposure: 0.01 (400 nm) (under the same exposure conditions as in Example 1)

Under the same conditions as in Example 1 this printing plate was fogged to light, then a negative image pattern was brought into vacuum contact with the printing plate, followed by image exposure and developing process. The processed plate thus obtained was attached to a printing machine and printing was performed by a conventional method. As a result, there was obtained a printed matter superior in image reproducibility with little deterioration of sensitivity caused by the presence of protective layer.

On the other hand, a printing plate was made in the same manner as above except that the 4-morpholino-2,5butoxybenzenediazonium hexafluoro phosphate as a photofading material was not incorporated in the protective layer. Then, under the same conditions as above the printing plate was fogged to light and subjected to image exposure and developing process to obtain a processed plate. As a result, there occurred "fog" of the photosensitive layer due to the fogging to light (this condition indicates that the photosensitive layer which is originally an unexposed area and should be completely peeled off in the developing process into a printing area, is exposed to light incompletely due to "fog" and there remains the photosensitive layer which should be peeled off) and thus the development was defective.

As set forth above, by covering the front side of the printing plate with a peelable or removable protective layer containing the photofading material, it is possible to attain good handleability in a light room without impairing the photosensitive characteristic of the printing plate. Further, by incorporating specific particles in the protective layer, it is possible to attain improved vacuum contact and the handleability in the plate making process is improved.

Thus, the present invention permits the printing plate to be used in a light room. And even slight fogging to light occurs in the plate making process, it is possible to obtain a processed plate without influence on image reproducibility, and thus the visual fatigue of the plate making worker can be reduced.

What is claimed is:

1. A silicone overlying type, dry planographic printing plate of which image formation is done by photoirradiation, said dry planographic printing plate comprising a base substrate, a photosensitive layer, an ink-repellent layer and a protective layer in that specified order, with said protective layer covering the front side of said printing plate and being removable, and said protective layer containing a photofading material.

2. A printing plate as set forth in claim 1, wherein said photofading material has a quantum efficiency in the range of 0.01 to 1.00.

3. A printing plate as set forth in claim 1, wherein said photofading material has a quantum efficiency in the range of 0.10 to 1.00.

4. A printing plate as set forth in claim 1, wherein said photofading material has a quantum efficiency in the range of 0.20 to 1.00.

5. A printing plate as set forth in claim 1, wherein said photofading material is an aromatic diazonium salt compound.

6. A printing plate as set forth in claim 1, wherein said protective layer containing said photofading material has an optical density in the range of 0.01 to 2.00.

7. A printing plate as set forth in claim 1, wherein said protective layer containing said photofading material has an optical density in the range of 0.20 to 2.00.

8. A printing plate as set forth in claim 1, wherein said protective layer contains particles having an average particle diameter of 4 μm to 9 μm as measured by a coulter counter method and having a refractive index of 1.40 to 1.70.

9. A printing plate as set forth in claim 1, wherein said protective layer contains particles having an average particle diameter of 4 μm to 9 μm as measured by a coulter counter method and having a refractive index of 1.40 to 1.60.

10. A printing plate as set forth in claim 8 or claim 9, wherein the amount of said particles incorporated in said protective layer is in the range of 0.001 g/m$^2$ to 0.1 g/m$^2$.

11. A printing plate as set forth in claim 8 or claim 9, wherein the amount of said particles incorporated in said protective layer is in the range of 0.01 g/m$^2$ to 0.1 g/m$^2$.

12. A printing plate as set forth in claim 1, wherein said protective layer has a thickness in the range of 0.1 μm to 20 μm.

13. A printing plate as set forth in claim 1, wherein said protective layer has a thickness in the range of 3 μm to 20 μm.

14. A printing plate as set forth in claim 1, wherein said protective layer comprises said photofading material and a plastic film.

15. A printing plate as set forth in claim 1, wherein said protective layer is in the form of a coated film formed by coating a composition comprising said photofading material and a binder to the surface of a plastic film.

16. A printing plate as set forth in claim 1, wherein said protective layer comprises said photofading material and particles, said particles having an average particle diameter of 4 μm to 9 μm as measured by a coulter counter method and refractive index of 1.40 to 1.70.

17. A printing plate as set forth in claim 1, wherein said protective layer is in the form of a coated film formed by coating a composition to the surface of a plastic film, said composition comprising said photofading material, particles having an average particle diameter of 4 μm to 9 μm as measured by a coulter counter method and a refractive index of 1.40 to 1.70, and a binder.

* * * * *